United States Patent [19]

Kamo et al.

[11] Patent Number: 4,816,948
[45] Date of Patent: Mar. 28, 1989

[54] MAGNETO-RESISTIVE HEAD

[75] Inventors: Yoshihisa Kamo, Kokubunji; Masahiro Kitada, Tokyo, both of Japan

[73] Assignee: Hitachi, Ltd., Tokyo, Japan

[21] Appl. No.: 13,115

[22] Filed: Feb. 10, 1987

[30] Foreign Application Priority Data

Feb. 10, 1986 [JP] Japan .................................. 61-25867

[51] Int. Cl.$^4$ ............................................. G11B 5/33
[52] U.S. Cl. .................................................... 360/113
[58] Field of Search ............... 360/113, 125, 126, 127, 360/122

[56] References Cited

U.S. PATENT DOCUMENTS

| | | | |
|---|---|---|---|
| 3,860,965 | 1/1975 | Voegeli | 360/113 |
| 3,864,751 | 2/1975 | Beaulieu et al. | 360/113 |
| 3,979,775 | 9/1976 | Schwarz | 360/113 |
| 4,103,315 | 7/1978 | Hempstead et al. | 360/113 |
| 4,663,685 | 5/1987 | Tsang | 360/113 |

OTHER PUBLICATIONS

Bajorek et al., "An Integrated Magnetoresistive Read, Inductive Write High Density Recording Head," AIP Conference Proceedings, No. 24, pp. 548-549, 1974.

Tsang, "Magnetics of Small Magnetoresistive Sensors (Invited)," J. Appl. Phys. 55(6), Mar. 15, 1984.

Primary Examiner—John H. Wolff
Assistant Examiner—Matthew J. Bussan
Attorney, Agent, or Firm—Antonelli, Terry & Wands

[57] ABSTRACT

Magneto-resistive head comprising a magneto-resistive film, and a soft magnetic film disposed at one side of said magneto-resistive film, which soft magnetic film is magnetized by electric current flowing through the magneto-resistive film, to which a bias magnetic field is applied by the magnetization of the soft magnetic film, whereby they are so structured that $0.7 \times B_{SMR} \times T_{MR} < B_{SSF} \times T_{SF}$ is satisfied, where $T_{MR}$ and $B_{SMR}$ represent the thickness and the saturated magnetic flux density, respectively, of the magneto-resistive film and $T_{SF}$ and $B_{SSF}$ represent the thickness and the saturated magnetic flux density, respectively, of the soft magnetic film.

6 Claims, 3 Drawing Sheets

MAGNETO-RESISTIVE HEAD

BACKGROUND OF THE INVENTION

This invention relates to the construction of a magneto-resistive head and in particular to the construction of a magnetic head for applying a bias magnetic field to a magneto-resistive film with a high efficiency.

Recently, magnetic heads (hereinbelow abbreviated to MR head) utilizing magneto-resistive film (hereinbelow abbreviated to MR film) have been used more and more widely. The reproduction output of the MR heads does not depend on the relative velocity between recording media and magnetic heads, and in particular a sensitivity higher than that of a conventional inductive head is expected at low velocities. A constant magnetic field is applied to the MR head from the exterior in order to improve the sensitivity and the linearity of the magneto-resistive effect. This magnetic field is called bias magnetic field. A number of methods for realizing it have been improved, such as (1) a method, by which a permanent magnet is located in the proximity of the MR film, (2) a method, by which a conductive film is placed in contact with the MR film, (3) a method, by which a soft magnetic film is located in the proximity of the MR film, etc. (cf. i.e. J. Appl. Phys. 55(6), Mar. 15, 1984 pp. 2226-2231 "Magnetics of small magneto-resistive sensors").

FIG. 1 illustrates a general construction of an MR head and FIG. 2 is its cross-sectional view. It is well-known that in the MR head two shield members 4 and 4' are, in order to increase its spatial resolution, disposed so that an MR film 1, a bias film 2 and an insulating film 3 are interposed therebetween, as indicated in the cross-sectional view of FIG. 2. At this time the axis of easy magnetization of the MR film 1 is oriented in the direction of the track width (M direction). In order to increase the sensitivity and the linearity of the MR film, the magnetization is previously oriented by the bias film 2 e.g. in an M' direction. In such a state, the MR head receives the signal magnetic field produced by the medium magnetization 15 on a recording medium 10 and detects variations in resistance of the MR film due to variations in inclination of the magnetization as signals.

When the bias means described previously are applied to the device indicated in FIG. 1, method (1) lacks the linearity, although it has a high sensitivity, and the sensitivity of method (2) is low, because the conductive film for bias short-circuits the MR film. The soft magnetic film bias indicated in method (3) has both a high sensitivity and a good linearity. However, heretofore, no consideration has been given to the thickness, magnetic characteristic, etc. of the MR film and the soft magnetic film for bias.

SUMMARY OF THE INVENTION

The object of this invention is to provide a structure for the soft magnetic film bias type MR head, where bias magnetic field can be applied thereto with a high efficiency by optimizing the thickness and the magnetic characteristics of the MR film and the soft magnetic film.

In order to achieve this object, this invention is characterized in that a soft magnetic film bias type MR head has a structure such that the magnetic flux passing through the soft magnetic film can be greater than that passing through the MR film at the optimum bias. Here the optimum bias means a bias state of the MR film, where the variations of the resistance of the MR film produced by the polarity inversion of the signal magnetic field coming from the magnetic recording medium are symmetric with respect to the magnetic field without signal in the positive and the negative directions.

DESCRIPTION OF THE PREFERRED EMBODIMENTS

Figure 1:
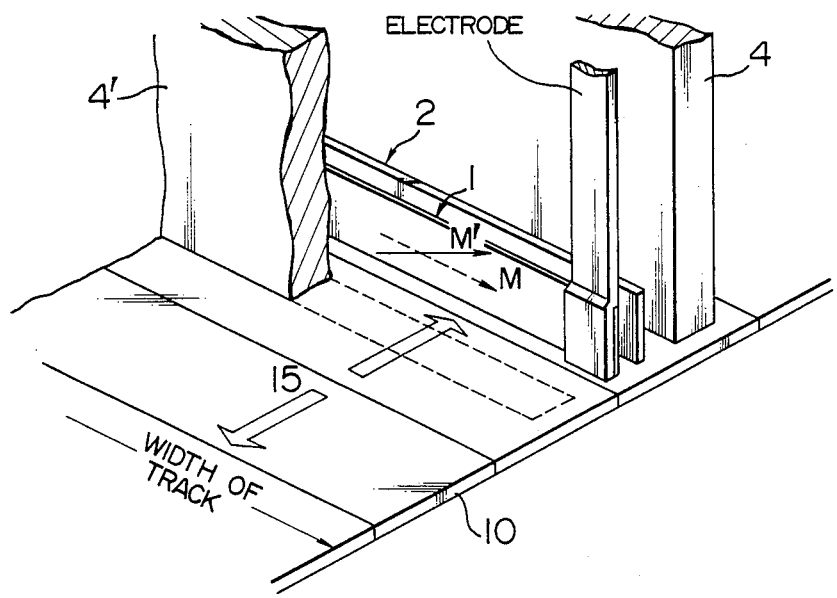
FIG. 1 is a perspective view of a general MR head.
Figure 2:
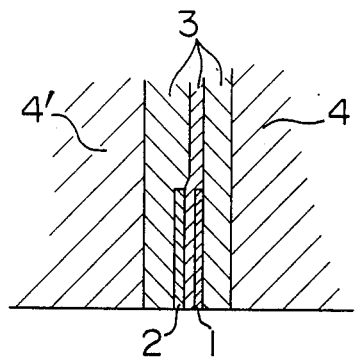
FIG. 2 is a cross-sectional view thereof.
Figure 3:
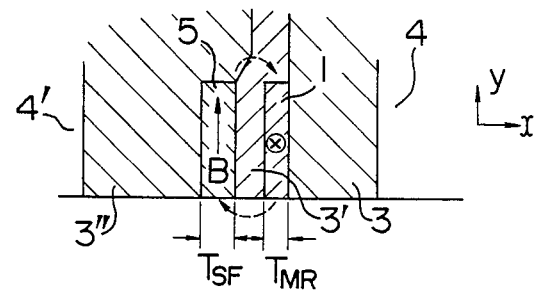
FIGS. 3 and 4 are a cross-sectional view and a plan view, respectively, of a soft magnetic film bias type MR head, to which this invention is applied.
Figure 4:
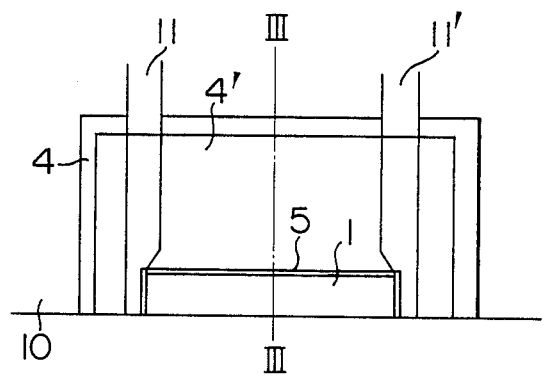

FIG. 4 is a plan view of a soft magnetic film bias type MR head according to this invention and FIG. 3 is a cross-sectional view thereof along line III—III in FIG. 4.

In the soft magnetic film bias the soft magnetic film 5 is disposed in the proximity of the MR film 1, as indicated in the cross-sectional view of FIG. 3, and magnetized by an electric current flowing (in the direction perpendicular to the sheet of the figure) through the MR film 1, which is in turn magnetized by the magnetization of the soft magnetic film 5. When the MR film 1 is biased at optimum, the magnetization is inclined at 45° with respect to the axis of easy magnetization (direction perpendicular to the sheet of FIG. 3). That is, the y-direction component of the magnetic flux density in FIG. 3 is $1/\sqrt{2}\ B_{SMR}$ ($B_{SMR}$ is the saturated magnetic flux density of the MR film)$\approx 0.7\ B_{SMR}$ and thus, denoting the thickness of the MR film by $T_{MR}$, the y-direction magnetic flux per unit length (per unit length in the direction perpendicular to the sheet of the figure) passing through the MR film is $0.7\ B_{SMR} \times T_{MR}$. All this magnetic flux should be produced by the soft magnetic film. Therefore, denoting the saturated magnetic flux density and the thickness of the soft magnetic film by $B_{SSF}$ and $T_{SF}$, respectively, the following relationship should be valid;

$$0.7 B_{SMR} \times T_{MR} < B_{SSF} \times T_{SF}.$$

Hereinbelow this invention will be explained by using a preferred embodiment.

A soft magnetic film bias type magnetic head used in this embodiment of this invention has been prepared by the method described below.

FIG. 4 is a plan view of the head used in this embodiment.

Figure 5:
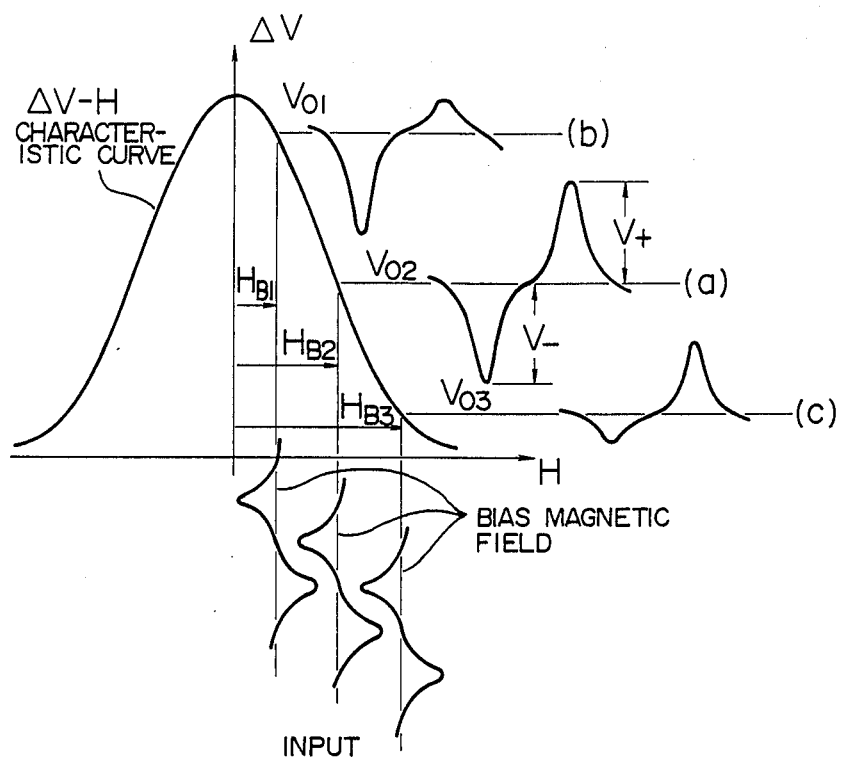
FIG. 5 is scheme for explaining the relation between the waveform reproduced by the MR head and the bias magnetic field.

A PERMALLOY film 2 μm thick is formed as a lower shield film 4 on a non-magnetic substrate 10. An $Al_2O_3$ (or $SiO_2$) film 1.0 μm thick is formed thereon as an insulating film 3. Further a PERMALLOY film 0.05 μm thick is formed thereon as the MR film 1 and then Al electrodes 11 and 11' are disposed at both the side of the MR film 1. Another $Al_2O_3$ film 0.3 μm thick is formed again thereon as an insulating film 3', further the soft magnetic film 5 is formed in a thickness of 0.03 μm, and finally another PERMALLOY film (2 μm thick) is formed as the upper shield film 4' thereon through an Al₂O₃ insulating film 3'' 0.7 μm thick. The height of the MR film and the soft magnetic film is approximately 15 μm. Signals of low recording density (about 1K flux change/2.5 cm (inch)) on a magnetic tape were reproduced by this head. Referring to FIG. 5 showing relations between variations ΔV in the terminal voltages of MR elements and external magnetic fields H, if the optimum bias is applied to an MR head, it will produce, in principle, an output of a waveform, which is symmetric with respect to the zero level, as indicated by (a) in FIG. 5. To the contrary, if the bias is too strong or weak, the reproduced waveform is not symmetric with respect to the zero level, as indicated in the figure by (b) and (c). The non symmetricity with respect to the zero level Δ is defined as;

$$\Delta = V_+ - V_- / V_+ + V_-,$$

where $V_+$ and $V_-$ represent the positive and the negative amplitude of the signal measured from the zero level. Δ=0 corresponds to the optimum bias.

Figure 6:
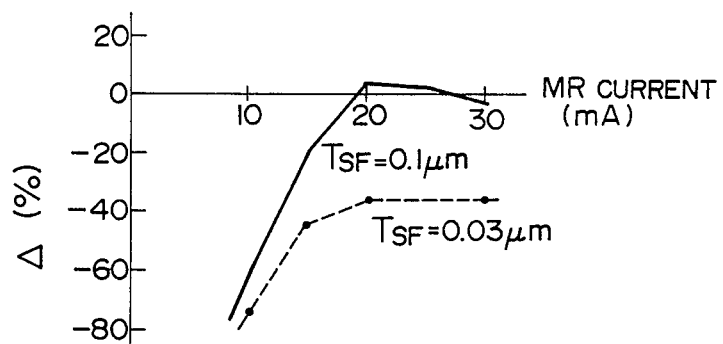
FIG. 6 is a graph representing measurement results illustrating the effect of this invention.

The relation between the current flowing through the MR film and Δ is obtained as indicated by the broken line in FIG. 6 by using the soft magnetic film bias type magnetic head, which has been fabricated previously. Δ is improved by increasing current, but the improvement of Δ is saturated at 15 mA. This MR head doesn't satisfy 0.7 $B_{SMR} \times T_{MR} < B_{SSF} \times T_{SF}$ (in this case $B_{SMR} = B_{SSF} = 1T$), since no bias magnetic field, which is greater than this value, can be applied to the MR film, because the soft magnetic film is saturated at this value.

When similar measurements are performed with a head formed in the same way, where the soft magnetic film is 0.1 μm thick, applying this invention, the curve indicated by the solid line in FIG. 6 is obtained, which traverses the line representing Δ=0. In this way it can be understood that the MR film can be optimally biased at.

Although the head in this embodiment is constructed such that the shield films are disposed at both sides, it is obvious that this invention optimizes the relation between the MR film and the soft magnetic film, but it depends neither on the material nor on the thickness of the shield films. It is also obvious that it does not depend on the presence or absence of the shield films.

Further it is evident that the same effect can be obtained by using a soft magnetic film made of an amorphous material such as CoZrNb, etc.

According to this invention, since it is possible to apply a sufficient bias to the MR film by optimizing the relation between the MR film and the soft magnetic film, a soft magnetic film bias type MR head having a good linearity and a high sensitivity can be realized.

We claim:
1. A magneto-resistive head comprising;
   a magneto-resistive film, and
   a soft magnetic film disposed at one side of said magneto-resistive film, which soft magnetic film is magnetized by electric current flowing through said magneto-resistive film, to which a bias magnetic field is applied by the magnetization of said soft magnetic film,
   wherein the thickness, $T_{MR}$, of said magneto-resistive film and the thickness, $T_{SF}$, of said soft magnetic film satisfy

$$0.7 \times B_{SMR} \times T_{MR} < B_{SSF} \times T_{SF},$$

where $B_{SMR}$ represents the saturated magnetic flux density of the magneto-resistive film and $B_{SSF}$ represents the saturated magnetic flux density of the soft magnetic film, whereby said soft magnetic film is operated at an unsaturated level and magnetic flux passing through said soft magnetic film can be greater than magnetic flux passing through said magneto-resistive film at optimum bias.

2. A magneto-resistive head according to claim 1, further comprising a first shield film disposed at one side of said soft magnetic film and a second shield film disposed at another side of said magneto-resistive film opposite said one side at which said soft magnetic film is disposed.

3. A magneto-resistive head according to claim 2, wherein said first shield film is separated from said soft magnetic film by first insulating film, and said second shield film is separated from said magnetic magneto-resistive film by a second insulating film.

4. A magneto-resistive head according to claim 1, wherein said soft magnetic film is made of an amorphous material.

5. A magneto-resistive head according to claim 4, wherein said amorphous material is CoZrNb.

6. A magneto-resistive head according to claim 1, wherein said soft magnetic film and said magneto-resistive film are separated by an insulating film.

* * * * *